(12) United States Patent
Owa

(10) Patent No.: US 6,781,187 B2
(45) Date of Patent: Aug. 24, 2004

(54) NONVOLATILE SEMICONDUCTOR MEMORY DEVICE

(75) Inventor: Yoshihito Owa, Hakushu-machi (JP)

(73) Assignee: Seiko Epson Corporation, Tokyo (JP)

( * ) Notice: Subject to any disclaimer, the term of this patent is extended or adjusted under 35 U.S.C. 154(b) by 144 days.

(21) Appl. No.: 10/153,686

(22) Filed: May 24, 2002

(65) Prior Publication Data

US 2002/0191453 A1 Dec. 19, 2002

(30) Foreign Application Priority Data

May 31, 2001 (JP) ........................................ 2001-165450

(51) Int. Cl.$^7$ ............................................. H01L 29/788
(52) U.S. Cl. ............. 257/316; 365/185.02; 365/185.03; 365/185.05; 365/185.11; 365/185.13; 365/185.14
(58) Field of Search ........................ 365/185.02, 185.03, 365/185.05, 185.11, 185.13, 185.14

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,963,465 A | 10/1999 | Eitan | |
| 5,969,383 A | 10/1999 | Chang et al. | |
| 6,177,318 B1 | 1/2001 | Ogura et al. | |
| 6,248,633 B1 * | 6/2001 | Ogura et al. ................. | 438/267 |
| 6,255,166 B1 | 7/2001 | Ogura et al. | |

FOREIGN PATENT DOCUMENTS

| | | |
|---|---|---|
| JP | 6-181297 | 6/1994 |
| JP | A 7-161851 | 6/1995 |
| JP | 9-162373 | 6/1997 |
| JP | B1 2978477 | 11/1999 |
| JP | 2000-49312 | 2/2000 |
| JP | A 2001-156188 | 6/2001 |
| JP | 2002-353346 | 12/2002 |

OTHER PUBLICATIONS

Hayashi et al., "Twin MONOS Cell with Dual Control Gates", 2000, IEEE VLSI Technology Digest.
Chang et al., "A New SONOS Memory Using Source–Side Injection for Programming", IEEE Electron Device Letters, vol. 19, No. 7, Jul. 1998, pp. 253–255.
Chen et al. A Novel Flash Memory Device with S Plit Gate Source Side Iinjection and ONO Charge Storage Stack (SPIN), 1997, VLSI Technology Digest, pp. 63–64.
U.S. patent application Ser. No. 09/955,160, Kanai et al., filed Sep. 19, 2001.
U.S. patent application Ser. No. 09/955,158, Kanai et al., filed Sep. 19, 2001.

(List continued on next page.)

*Primary Examiner*—David Nelms
*Assistant Examiner*—Mai-Huong Tran
(74) *Attorney, Agent, or Firm*—Oliff & Berridge, PLC

(57) ABSTRACT

A nonvolatile semiconductor memory device including a plurality of memory cells each of which has two MONOS memory cells controlled by one word gate and two control gates, the memory cells being arranged in first and second directions. Each two control gate lines connected in common with one sub control gate line have a wide spacing region having a large line-to-line width, a common connection region in which the two lines are connected in common in one line, and a narrow spacing region having a small line-to-line width which is disposed in a region other than the wide spacing region and the common connection region. The wide spacing regions are disposed in the second direction, one on both sides of the common connection region in first and second wiring-only regions in a memory cell array region. The wide spacing region is an enlarged region of bit lines in which a contact is formed. The common connection region is a discontinuous region of the bit line.

19 Claims, 13 Drawing Sheets

OTHER PUBLICATIONS

U.S. patent application Ser. No. 10/115,956, Kamei, filed Apr. 5, 2002.

U.S. patent application Ser. No. 10/115,913, Kamei, filed Apr. 5, 2002.

U.S. patent application Ser. No. 10/153,736, Owa, filed May 24, 2002.

U.S. patent application Ser. No. 10/153,611, Owa, filed May 24, 2002.

* cited by examiner

NONVOLATILE SEMICONDUCTOR MEMORY DEVICE

Japanese Patent Application No. 2001-165450 filed on May 31, 2001, is hereby incorporated by reference in its entirety.

BACKGROUND OF THE INVENTION

The present invention relates to a nonvolatile semiconductor memory device including memory cells, each having two nonvolatile memory elements controlled by one word gate and two control gates.

As one type of nonvolatile semiconductor memory device, a MONOS (Metal-Oxide-Nitride-Oxide-Semiconductor or Substrate) device is known. In the MONOS nonvolatile semiconductor memory device, a gate insulating layer between a channel and a gate is formed of a laminate consisting of a silicon oxide film, silicon nitride film, and silicon oxide film. Charges are trapped in the silicon nitride film.

The MONOS nonvolatile semiconductor memory device is disclosed in literature (Y. Hayashi, et al., 2000 Symposium on VLSI Technology Digest of Technical Papers, pp. 122–123). This literature discloses a twin MONOS flash memory cell including two nonvolatile memory elements (MONOS memory cells) controlled by one word gate and two control gates. Specifically, one flash memory cell has two charge trap sites.

In order to drive the twin MONOS flash memory cell, two bit lines, one word line, and two control gate lines are necessary.

Of these interconnects, two bit lines and two control gate lines are generally wired along the column direction. However, it is difficult to provide four interconnects (two bit lines and two control gate lines) within the width of a plurality of memory cells in one column using the same metal interconnect layer even in the case of using a photolithographic process with a minimum line & space width.

Therefore, the wiring space must be secured by increasing the width of the memory cells in one column. However, this causes a decrease in the degree of integration of the memory cells, whereby it is impossible to deal with a recent increase in the capacity of the nonvolatile semiconductor memory device.

BRIEF SUMMARY OF THE INVENTION

The present invention may provide a highly integrated nonvolatile semiconductor memory device in which one memory cell has two trap sites.

The present invention may also provide a nonvolatile semiconductor memory device in which memory cells are highly integrated by reducing the pitch of control gate lines and bit lines.

The present invention may also provide a nonvolatile semiconductor memory device capable of securing the degree of margin and freedom relating to the arrangement of interconnects for supplying electric power to the control gates and bit lines.

According to one aspect of the present invention, there is provided a nonvolatile semiconductor memory device comprising a memory cell array region in which a plurality of memory cells are arranged in first and second directions intersecting each other, each of the memory cells having two nonvolatile memory elements and being controlled by one word gate and two control gates.

The memory cell array region includes: a plurality of control gate lines which connects in the first direction the control gates in each column of the memory cells disposed in the first direction; and sub control gate lines extending in the first direction in an upper layer of the control gate lines, the number of the sub control gate lines being half the number of the control gate lines.

Each of the sub control gate lines is connected to adjacent two of the control gate lines in adjacent two of the memory cells in the second direction. Since the number of the sub control gate lines is substantially half the number of the control gate lines, the degrees of margin and freedom relating to arrangement of the sub control gate lines are increased.

Each two of the control gate lines have a wide spacing region having a large line-to-line width, a common connection region in which the two lines are connected in common in one line, and a narrow spacing region having a small line-to-line width. The wide spacing regions are disposed on both sides of the common connection region in the second direction. Since a comparatively large space can be secured on both sides of the common connection region in which two control gate lines are connected in common, the wide spacing regions of each two control gate lines adjacent thereto are disposed by utilizing the large space. The wide spacing region may be used as a contact region for other interconnects such as bit lines.

Since the common connection regions for which a large space is not needed are formed on both sides of the wide spacing region, it is unnecessary to increase the space for forming the wide spacing region. This eliminates the need to decrease the degree of integration in order to secure the wiring space for the control gate lines even if one memory cell has two trap sites, whereby a highly integrated nonvolatile semiconductor memory device can be provided.

The width of the common connection region may be larger than the width of each two of the control gate lines in the wide spacing region. This enables each two of the control gate lines to be connected with one of the sub control gate lines at the common connection region having a large width.

First and second wiring-only regions may be formed in the memory cell array region and separated from each other in the first direction. In the first wiring-only region, the common connection region may be connected to an even-numbered sub control gate line, and the wide spacing region may be connected to an odd-numbered sub control gate line. In the second wiring-only region, the common connection region maybe connected to an odd-numbered sub control gate line, and the wide spacing region may be connected to an even-numbered sub control gate line.

The arrangement pitch of the control gate lines can be minimized by disposing the common connection regions and the wide spacing regions in a zigzag arrangement.

The nonvolatile semiconductor memory device may further comprise: a plurality of bit lines disposed between each two of the control gate lines and formed of impurity layers extending in the first direction; and a plurality of sub bit lines which extend in the first direction in an upper layer of the bit lines and are connected to the bit lines, the number of the sub bit lines being equal to the number of the bit lines.

In this case, each of the bit lines may be divided into a plurality of bit split lines by a discontinuous region which faces the common connection region. Each of the sub bit lines may be connected to the bit split lines which make up one of the bit lines. This enables the bit lines divided in the first direction to be backed by the sub bit lines.

Each of the bit lines may have an enlarged region which faces the wide spacing region of each two of the control gate lines and have an increased line width. Each of the bit lines may be connected to the sub bit lines at the enlarged region. Since the discontinuous regions of the bit lines are provided on both sides of the enlarged region of the bit line, it is unnecessary to increase the pitch of the bit lines for forming the enlarged region, whereby the memory cells can be highly integrated.

The sub bit lines may make up a first metal interconnect layer, and the sub control gate lines may make up a second metal interconnect layer.

In this case, each of the bit lines may be connected to one of the sub bit lines through a contact formed in the enlarged region, and each two of the control gate lines may be connected with one of the sub control gate lines through a connection section formed in the common connection region. The connection section may include a contact, the island-like first metal interconnect layer, and a via.

The contact and the connection section may be substantially formed in a single line in the first direction. In this case, each of the sub bit lines avoids the connection section in order to prevent interference with the connection section.

The nonvolatile semiconductor memory device may further comprise: a select region disposed adjacent to the memory cell array region in the first direction; a plurality of main control gate lines extending in the first direction in the select region and the memory cell array region, the number of the main control gate lines being smaller than the number of the sub control gate lines; and a plurality of main bit lines extending in the first direction in the select region and the memory cell array region, the number of the main bit lines being smaller than the number of the sub bit lines. This enables the number of main bit lines and the number of main control gate lines to be decreased, whereby a surplus of wiring space is produced because the total number of interconnects decreases even if the main bit lines and the main control gate lines are disposed in the same layer.

Specifically, the main bit lines and the main control gate lines may make up a third metal interconnect layer.

In this case, the select region may include: a sub control gate select circuit which selectively connects the sub control gate lines with the main control gate lines; and a sub bit select circuit which selectively connects the sub bit lines with the main bit lines.

The select region may include first and second select regions disposed on both sides of the memory cell array region in the first direction. The degree of freedom relating interconnect is further increased by dividing the select region to which the sub bit lines and the sub control gate lines extend in two.

The first select region may include: a first sub bit select circuit which selectively connects one of an odd-numbered sub bit line and an even-numbered sub bit line with the main bit lines; and a first sub control gate select circuit which selectively connects one of an odd-numbered sub control gate line and an even-numbered sub control gate line with the main control gate lines. The second select region may include: a second sub bit select circuit which selectively connects the other of the odd-numbered sub bit line and the even-numbered sub bit line with the main bit lines; and a second sub control gate select circuit which selectively connects the other of the odd-numbered sub control gate line and the even-numbered sub control gate line with the main control gate lines.

Since the control gate select circuits can be dispersed in the first and second select regions in this manner, the circuit layout is facilitated.

A plurality of memory blocks each of which is formed of the memory cell array region and the first and second select regions disposed on both sides of the memory cell array region may be arranged in the first direction. This enables an increase in the storage capacity of the nonvolatile semiconductor memory device. Moreover, since the length of the sub control gate lines and the sub bit lines can be decreased, wiring capacitance can be reduced. Furthermore, since data can be collectively erased in the block unit, the erase unit can be reduced in comparison with the case of erasing data over the entire memory.

In this case, a main bit line driver which drives the plurality of the main bit lines may be provided on one end of the memory blocks arranged in the first direction.

This enables the main bit lines to be shared by the memory blocks, and the main bit line driver to be shared by the memory blocks.

In addition, a main control gate line driver which drives the plurality of the main control gate lines may be provided on the other end of the memory blocks arranged in the first direction.

This enables the main control gate lines to be shared by the memory blocks, and the main control gate line driver to be shared by the memory blocks.

A word line driver which drives a plurality of word lines may be provided on either side of the memory blocks in the second direction. In order to further increase the storage capacity of the nonvolatile semiconductor memory device, the memory blocks may be disposed on both sides of the word line driver in the second direction.

Each of the two nonvolatile memory elements may have an ONO film consisting of an oxide film (O), nitride film (N), and oxide film (O) as a charge trap site. However, other types of structures may be employed.

DETAILED DESCRIPTION OF THE EMBODIMENT

An embodiment of the present invention is described below with reference to the drawings.

Structure of Memory Cell

Figure 1:
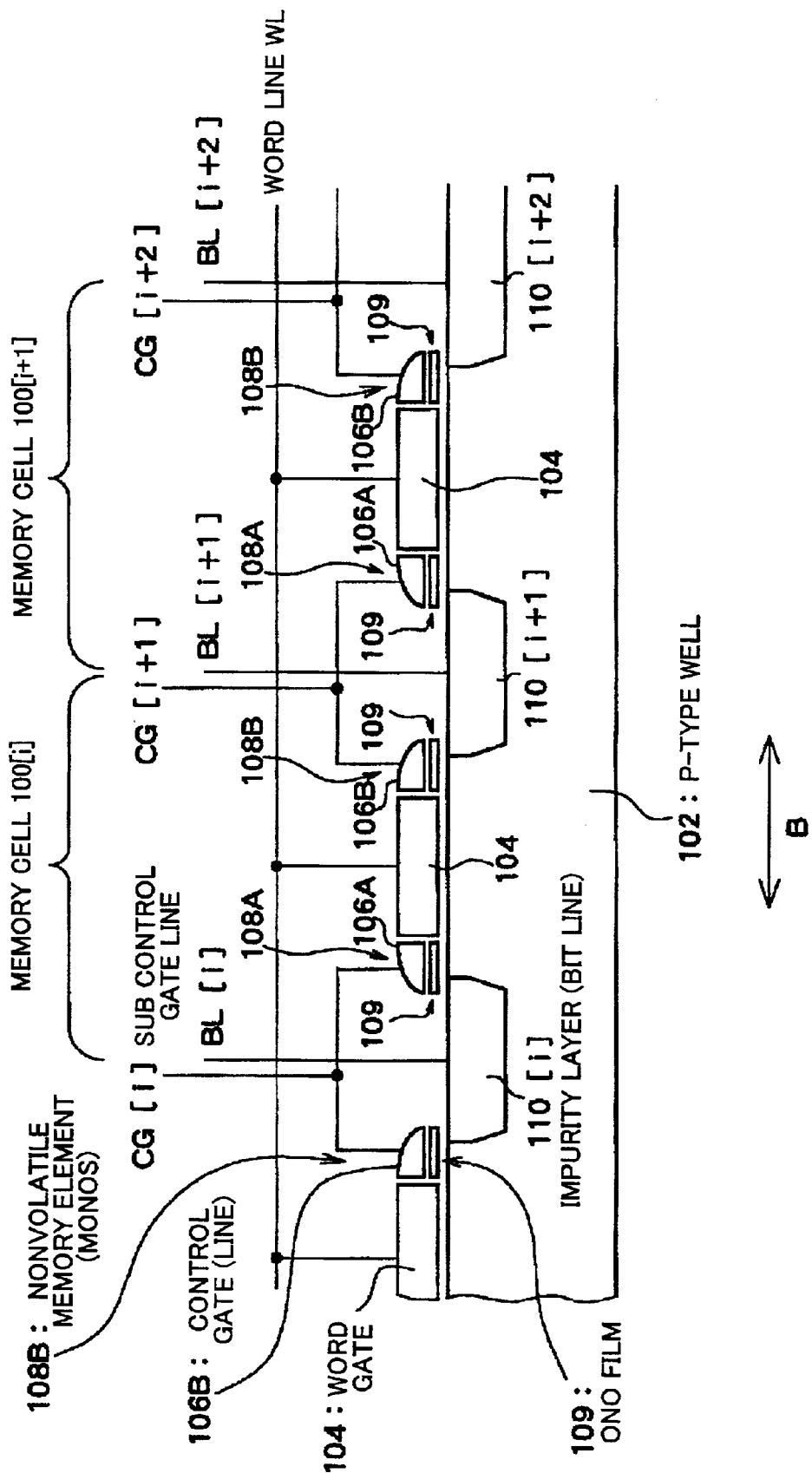
FIG. 1 is a cross-sectional view showing memory cells used in a nonvolatile semiconductor memory device according to one embodiment of the present invention.
Figure 2:
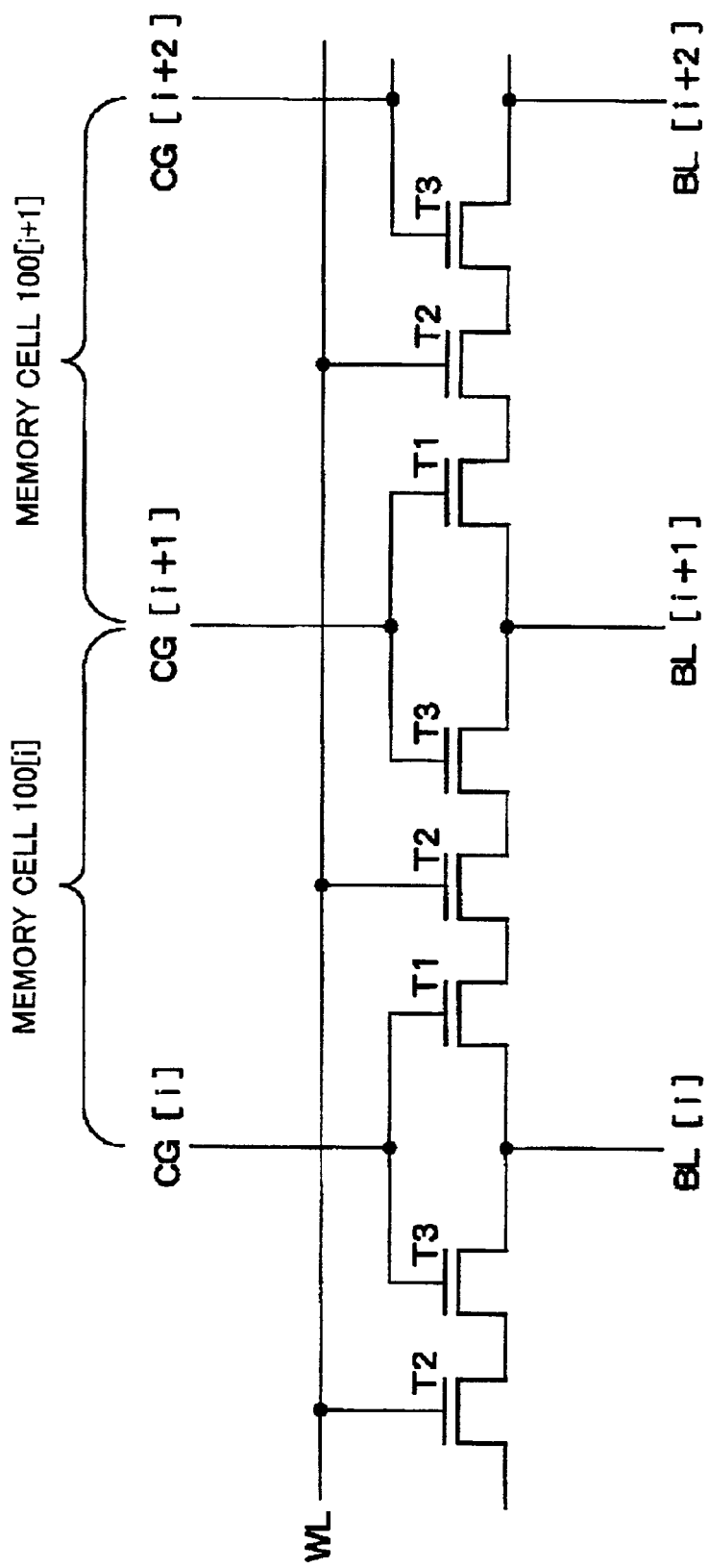
FIG. 2 is an equivalent circuit diagram of the memory cells shown in FIG. 1.

FIG. 1 shows across section of a nonvolatile semiconductor memory device. FIG. 2 is an equivalent circuit diagram of the nonvolatile semiconductor memory device. In FIG. 1, one memory cell 100 includes a word gate 104 formed of a material containing polysilicon or the like on a P-type well region 102 on a silicon substrate through a gate oxide film, two control gates 106A and 106B, and two memory elements (MONOS memory cells) 108A and 108B.

The control gates 106A and 106B are formed on opposite sidewalls of the word gate 104. The control gates 106A and 106B are electrically insulated from the word gate 104.

Each of the memory elements 108A and 108B is formed by layering an oxide film (O), nitride film (N), and oxide film (O) between either the control gate 106A or 106B which corresponds to M (Metal) in the MONOS and the P-type well 102 which corresponds to S (Silicon) in the MONOS. The control gates 106A and 106B may be formed using a conductive material such as doped silicon or silicide.

Therefore, one memory cell 100 includes two MONOS memory cells 108A and 108B, each having a split gate (control gates 106A and 106B). One word gate 104 is shared by the MONOS memory cells 108A and 108B.

The MONOS memory cells 108A and 108B function as charge trap sites. Each of the MONOS memory cells 108A and 108B can trap charges in the ONO film 109.

As shown in FIGS. 1 and 2, a plurality of word gates 104 arranged at intervals in the row direction (second direction B in FIGS. 1 and 2) is connected in common with one word line WL formed of a polycide or the like.

The control gates 106A and 106B shown in FIG. 1 extend along the column direction (first direction A perpendicular to the surface of FIG. 1), and are shared by a plurality of memory cells 100 arranged in the column direction. Therefore, the control gates 106A and 106B may be referred to as control gate lines.

A sub control gate line CG [i+1] consisting of a second metal layer formed in an upper layer of the control gate lines is connected with the control gate line 106B in the [i] th memory cell 100 [i] and the control gate line 106A in the [i+1] st memory cell 100 [i+1].

An [i+1] st impurity layer 110 [i+1] shared by the MONOS memory cell 108B in the [i] th memory cell 100 [i] and the MONOS memory cell 108A in the [i+1] st memory cell 100 [i+1] is formed in the P-type well 102.

The impurity layers 110 [i], [i+1], and [i+2] are formed in the P-type well, and function as bit lines which extend along the column direction (first direction A perpendicular to the surface of FIG. 1) and are shared by a plurality of memory cells 100 arranged in the column direction, for example. Therefore, the impurity layers 110 [i], [i+1], [i+2], . . . may be referred to as the bit lines.

Sub bit lines BL [i], [i+1], and [i+2] formed of a first metal layer, for example, are connected with the impurity layers (bit lines) 110 [i], [i+1], and [i+2].

Data Read Operation from Memory Cell

As shown in FIG. 2, a transistor T2 driven by the word gate 104 and transistors T1 and T3 respectively driven by the control gates 106A and 106B are connected in series in one memory cell 100.

Figure 3:
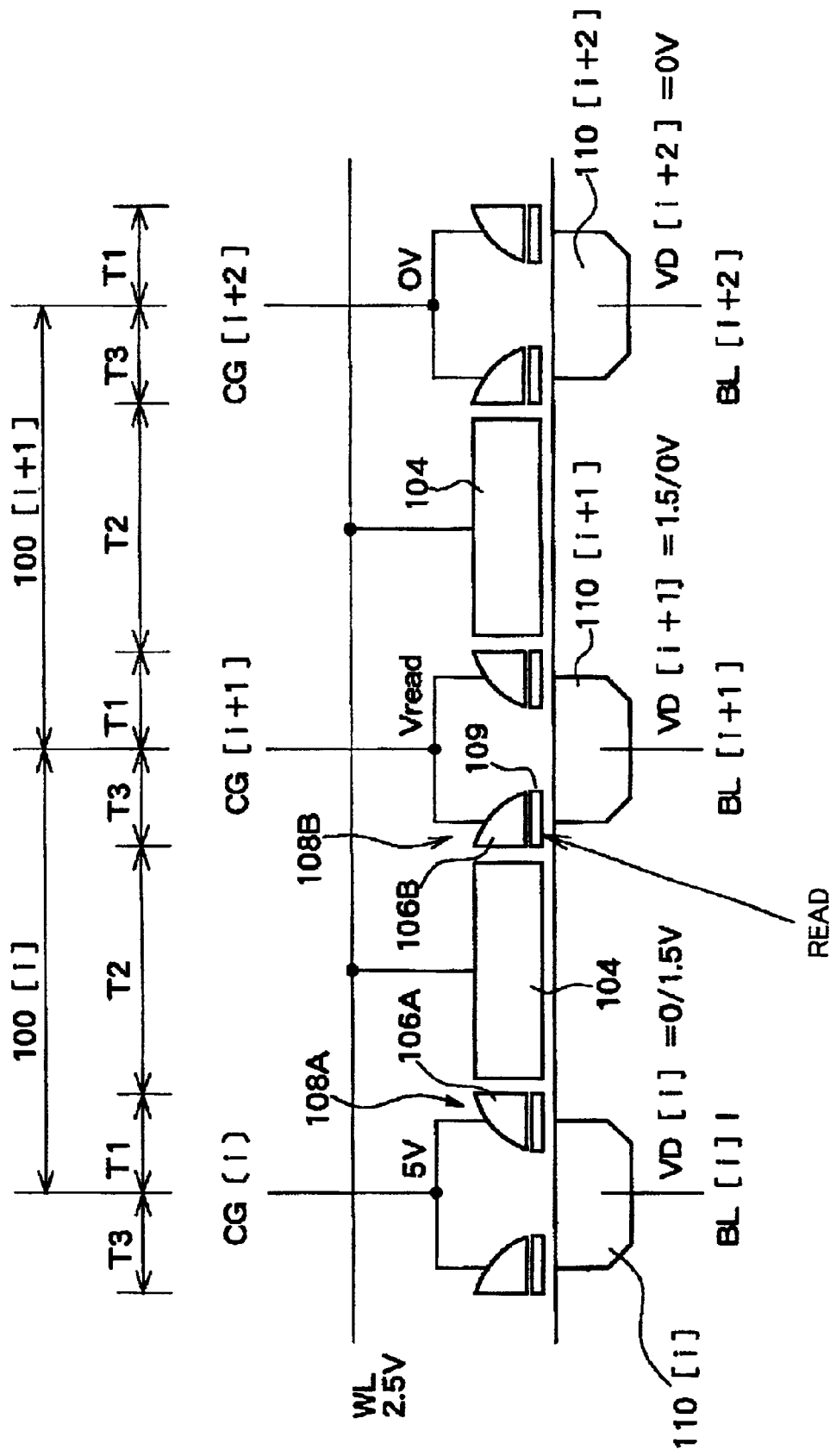
FIG. 3 is schematically illustrative of a data read operation of the nonvolatile semiconductor memory device shown in FIG. 1.

Setting of the potential at each point of two adjacent memory cells 100 [i] and [i+1] is described below with reference to FIG. 3. FIG. 3 is a view for describing reading of data from the MONOS memory cell 108B on the right of the word gate 104 in the memory cell 100 [i]. The following description of the operation is given on the assumption that the threshold voltage of the transistors T1 to T3 is less than 2.5 V.

Each of the transistors T2 is turned ON by applying 2.5 V to each of the word gates 104, for example. The transistor T1 corresponding to the MONOS memory cell 108A is turned ON by applying an override voltage (5 V, for example) to the control gate 106A on the left side of the memory cell 100 [i] through the sub control gate line CG [i]. A read potential Vread is applied as a potential VCG of the control gate 106B on the right side of the memory cell 100 [i].

The operation of the transistor T3 corresponding to the MONOS memory cell 108B differs as described below depending upon whether or not charges are stored in the MONOS memory cell 108B on the right of the word gate 104.

Figure 4:
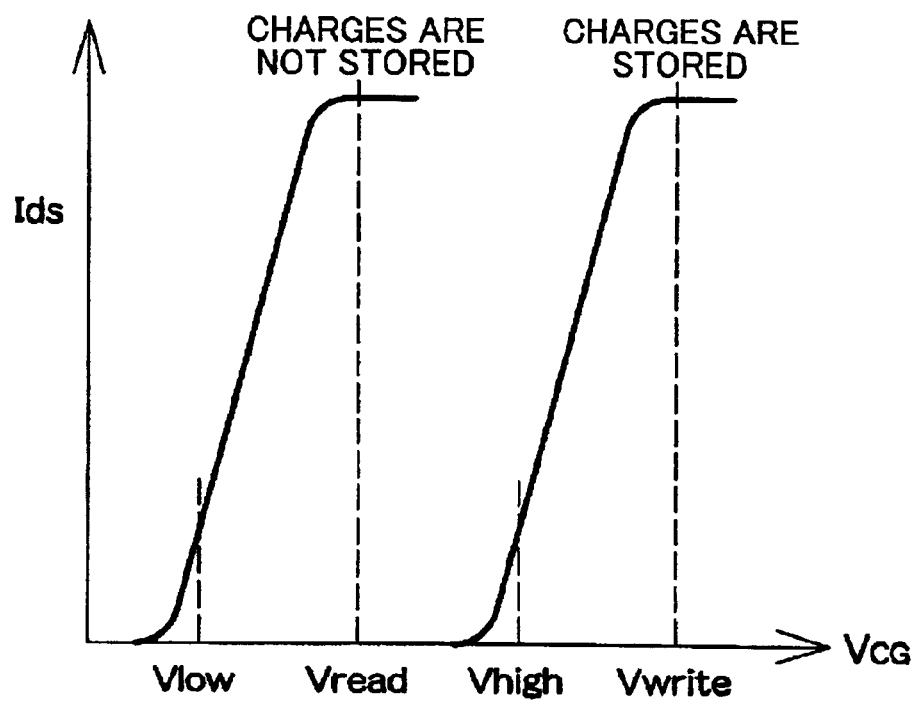
FIG. 4 is a characteristic diagram showing the relationship between a control gate voltage VCG and source-drain current Ids in the memory cells shown in FIG. 1.

FIG. 4 shows the relation between a voltage applied to the control gate 106B on the right side of the memory cell 100 [i] and a current Ids which flows between the source and drain of the transistor T3 which corresponds to the MONOS memory cell 108B controlled by this voltage.

As shown in FIG. 4, in the case where charges are not stored in the MONOS memory cell 108B, the current Ids starts to flow when the control gate potential VCG exceeds a lower threshold voltage Vlow. In the case where charges are stored in the MONOS memory cell 108B, the current Ids does not start to flow unless the control gate potential VCG exceeds a higher threshold voltage Vhigh.

The voltage Vread applied to the control gate 106B at the time of reading data is set to approximately an intermediate voltage (2.5 V, for example) between the two threshold voltages Vlow and Vhigh.

Therefore, the current Ids flows if charges are not stored in the MONOS memory cell 108B, and the current Ids does not flow if charges are stored in the MONOS memory cell 108B.

At the time of reading data, the impurity layer 110 [i] (bit line [i]) is connected to a sense amplifier and a potential VD [i+1] of the impurity layer 110 [i+1] (bit line [i+1]) is set to 1.5 V. This allows the current Ids to flow when charges are not stored in the MONOS memory cell 108B, whereby a current of 25 $\mu$A or more flows through the sub bit line BL [i] through the transistors T1 and T2 in an ON state, for example. Since the current Ids does not flow when charges are stored in the MONOS memory cell 108B, current flowing through the sub bit line BL [i] is less than 10 nA even if the transistors T1 and T2 are in an ON state, for example. Therefore, data can be read from the MONOS memory element 108B (selected cell) in the twin memory cell 100 [i] by detecting the current flowing through the sub bit line BL [i] using the sense amplifier.

The transistors T1 and T2 are turned ON in the memory cell 100 [i+1]. However, since the control gate potential VCG of the transistor T3 is set to 0 V, which is lower than the threshold voltages Vlow and Vhigh shown in FIG. 3, the source-drain current does not flow in the memory cell 100 [i+1]. Therefore, data storage conditions in the memory cell 100 [i+1] do not adversely affect the reading of data from the memory cell 100 [i].

In the case of reading data from the MONOS memory cell 108A on the left side of the memory cell 100 [i], the potential at each point of the memory cell 100 [i−1] and [i] is set in the same manner as described above.

Programming of Memory Cell

Figure 5:
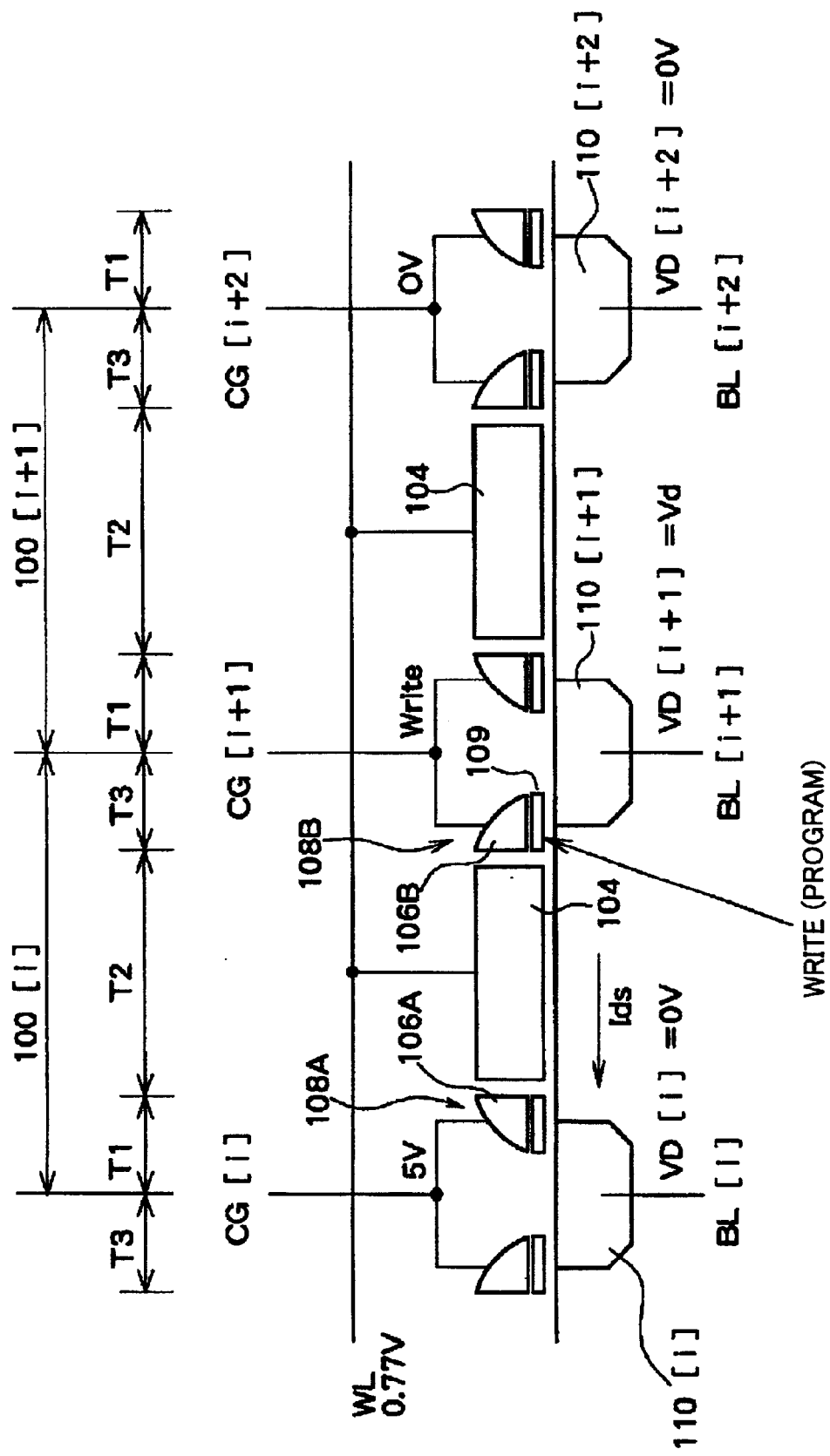
FIG. 5 is schematically illustrative of a data write (program) operation of the nonvolatile semiconductor memory device shown in FIG. 1.

FIG. 5 is a view for describing data programming of the MONOS memory cell 108B on the right of the word gate 104 in the memory cell 100 [i]. A data erase operation described later has been performed before this data program operation.

In FIG. 5, the potential of the sub control gate line CG [i] is set to the override potential (5 V, for example), and the potential of the sub control gate line CG [i+2] is set to 0 V in the same manner as shown in FIG. 3. However, the potential of each word gate 104 is set to about 0.77 to 1 V by the word line WL, for example. The potential of the control gate 108B on the right side of the memory cell 100 [i] is set to the write potential Vwrite (5 to 6 V, for example) shown in FIG. 4, through the sub control gate line CG [i+1]. The potential VD [i+1] of the [i+11] st impurity layer 110 [i+1] (bit line [i+1]) is set to 4.5 to 5 V through the sub bit line BL [i+1], for example.

This causes the transistors T1 and T2 in the memory cell 100 [i] to be turned ON, whereby the current Ids flows toward the impurity layer 110 [i] and channel hot electrons (CHE) are trapped in the ONO film 109 of the MONOS memory cell 108B. The program operation of the MONOS memory cell 108B is performed in this manner, whereby data "0" or "1" is written in.

Data Erase of Memory Cell

Figure 6:
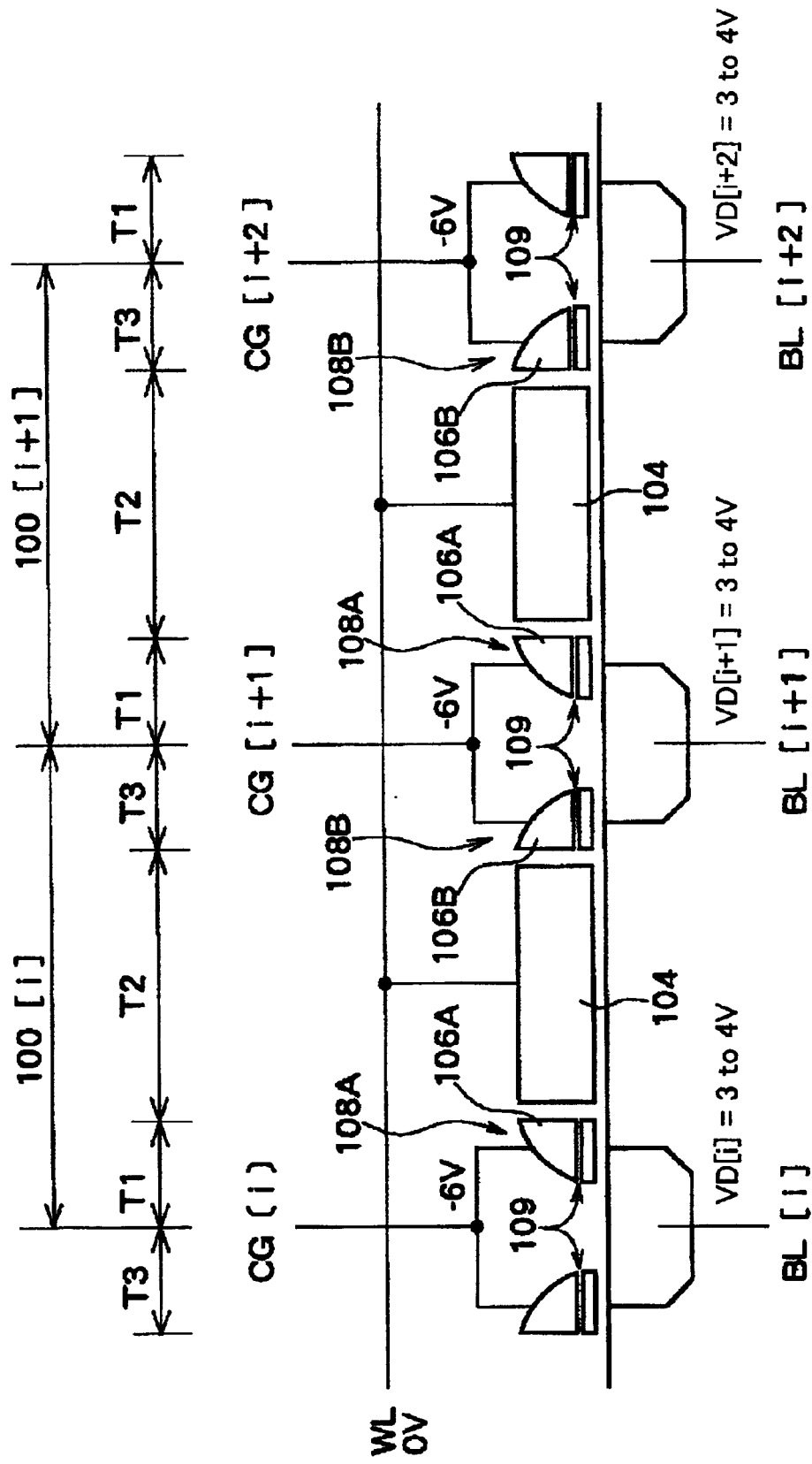
FIG. 6 is schematically illustrative of a data erase operation of the nonvolatile semiconductor memory device shown in FIG. 1.

FIG. 6 is a view for describing data erase of the memory cells 100 [i] and [i+1] connected to the word line WL.

In FIG. 6, the potential of each word gate 104 is set to 0 V by the word line WL. The potential of the control gates 106A and 106B is set to about −5 to −6 V by the sub control gate lines CG [i], [i+1], and [i+2], for example. The potential of the impurity layers (bit lines) 110 [i], [i+1], and [i+2] is set to 3–4 V (equal to the potential of the P-type well) by the sub bit lines BL [i], [i+1], and [i+2].

This causes electrons trapped in the ONO films 109 of the MONOS memory cells 108A and 108B to be extracted and erased by a tunnel effect caused by an electric field formed by −5 to −6 V being applied to the metal (M) and 3 to 4 V being applied to the silicon (S). This enables data to be erased in a plurality of memory cells at the same time. Differing from the above example, the stored electrons maybe erased by forming hot holes using band-band tunneling on the surface of the impurity layers which become the bit lines.

Entire Configuration of Nonvolatile Semiconductor Memory Device

The nonvolatile semiconductor memory device formed by using the above-described memory cells 100 is described below with reference to FIGS. 7 and 8.

Figure 7:
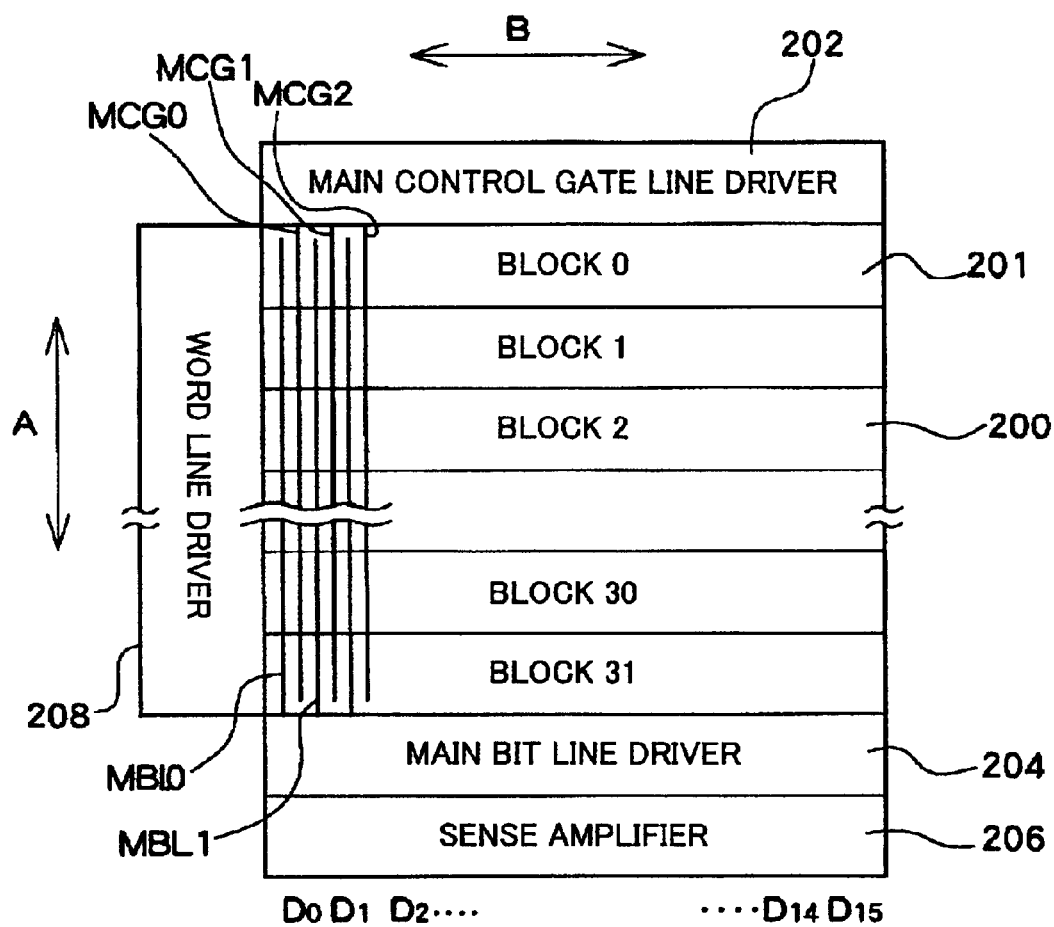
FIG. 7 shows a planar layout of the entire nonvolatile semiconductor memory device shown in FIG. 1.

FIG. 7 is a view showing a planar layout of the nonvolatile semiconductor memory device. A memory region 200 is divided into 32 memory blocks 201, for example. A main control gate line driver 202 is formed on one end of the memory region 200 in the first direction A. A main bit line driver 204 and a sense amplifier 206 are formed on the other end in the first direction A. A word line driver 208 is formed on one end of the memory region 200 in the second direction B.

The main control gate line driver 202 drives main control gate lines MCG0, MCG1, . . . formed of a third metal interconnect layer extending along the first direction A across the memory blocks 201 (blocks No. 0 to No. 31), for example.

The main bit line driver 204 drives main bit lines MBL0, MBL1, . . . formed of the third metal interconnect layer extending along the first direction A across the memory blocks 201 (blocks No. 0 to No. 31), for example.

Figure 8:
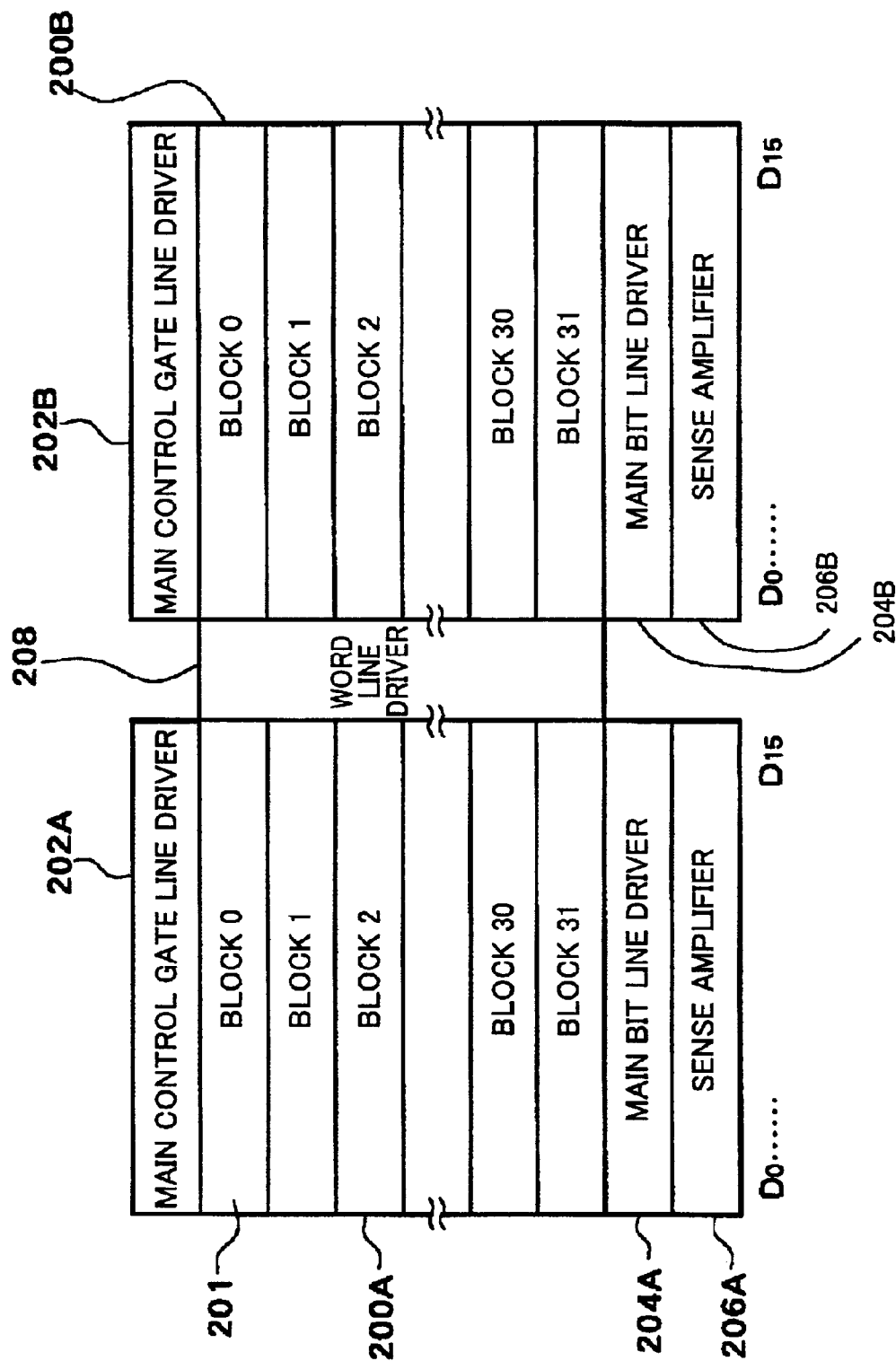
FIG. 8 shows another example of the planar layout of the entire nonvolatile semiconductor memory device shown in FIG. 1.

FIG. 8 is a view showing a nonvolatile semiconductor memory device having two memory regions 200A and 200B. A main control gate line driver 202A, a main bit line driver 204A, and a sense amplifier 206A are formed in the memory region 200A. A main control gate line driver 202B, a main bit line driver 204B, and a sense amplifier 206B are formed in the memory region 200B. The word line driver 208 is disposed between the memory regions 200A and 200B and shared by the memory regions 200A and 200B.

The layout of the nonvolatile semiconductor memory device is not limited to those shown in FIGS. 7 and 8. Various types of modifications are possible. In the case where the storage capacity of the memory region 200 is 16 Mbits, for example, the storage capacity of the nonvolatile semiconductor memory device having four memory regions 200 is 16×4=64 Mbits.

In each of the memory blocks 201 formed by dividing the memory region 200 having a storage capacity of 16 Mbits into 32 sections, 2 k (4 kbit) memory cells 100 are connected to one word line WL. 128 word lines WL are disposed in each memory block. Therefore, each memory block 201 has a storage capacity of 32 kwords (64 kbytes). In each of the memory regions 200 (200A and 200B) shown in FIGS. 7 and 8, 16-bit data can be read or written at the same time through output terminals D0 to D15 (each one bit).

Configuration of Memory Block

The configuration of one memory block 201 formed by dividing the memory region 200 into 32 sections, for example, is described below with reference to FIG. 9.

Figure 9:
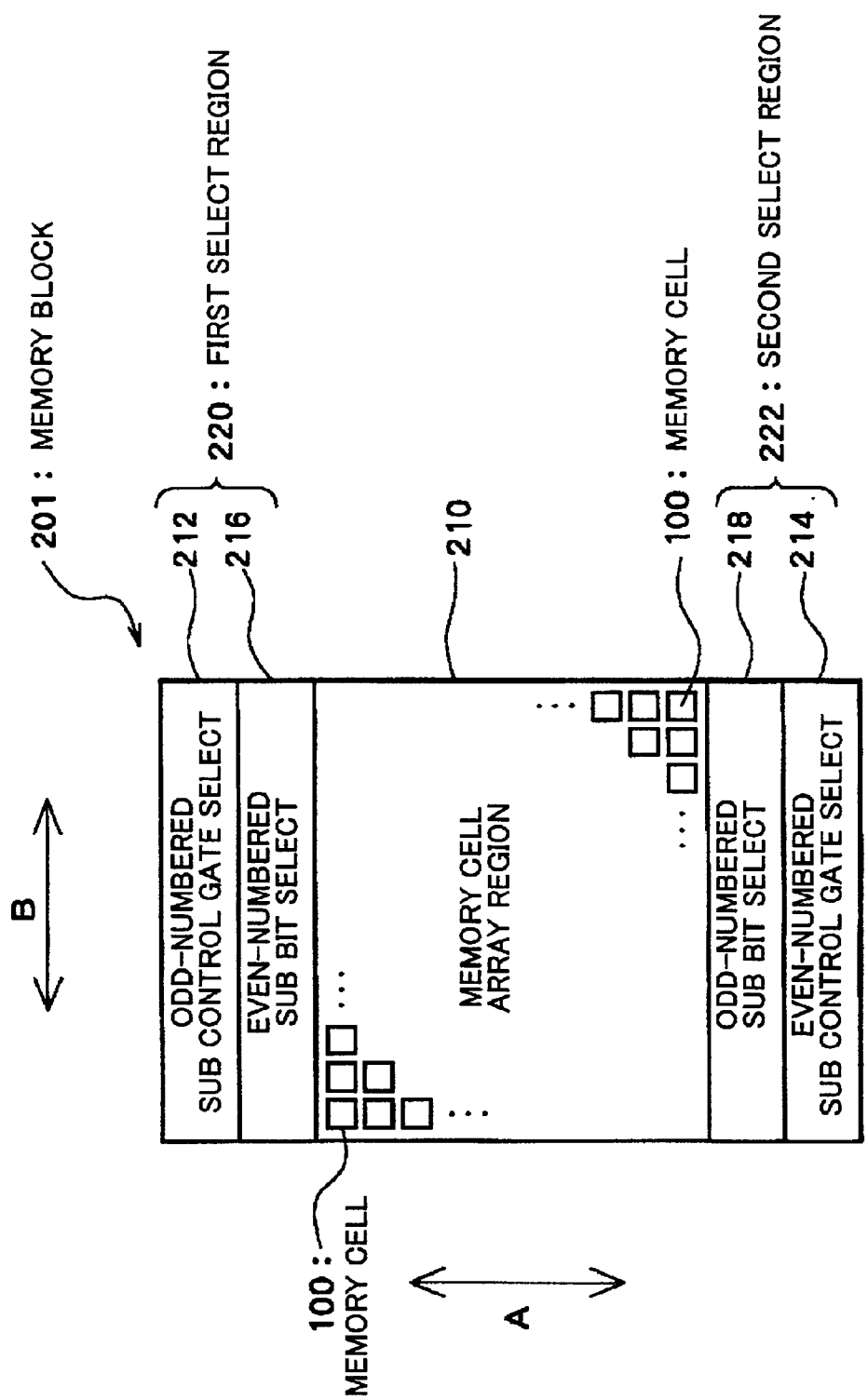
FIG. 9 shows a memory block shown in FIG. 7 or 8.

FIG. 9 is a view showing a planar layout of one memory block 201 shown in FIGS. 7 and 8. In FIG. 9, the memory block 201 includes a memory cell array region 210 in which a plurality of memory cells 100 is arranged in the first and second directions A and B which intersect each other. A first select region 220 and a second select region 222 are formed on opposite sides of the memory cell array region in the first direction A. The first select region 220 is divided into an odd-numbered sub control gate select circuit 212 and an even-numbered sub bit select circuit 216. The second select region 222 is divided into an even-numbered sub control gate select circuit 214 and an odd-numbered sub bit select circuit 218.

FIGS. 10 to 13 are views showing the details of the memory cell array region 210 in the memory block 201. In FIGS. 10 to 13, 256 word lines WL0 to WL255 extending in the second direction B are formed in the memory cell array region 210, for example. The word lines WL0 to WL255 are formed of a polycide or the like.

Figure 10:
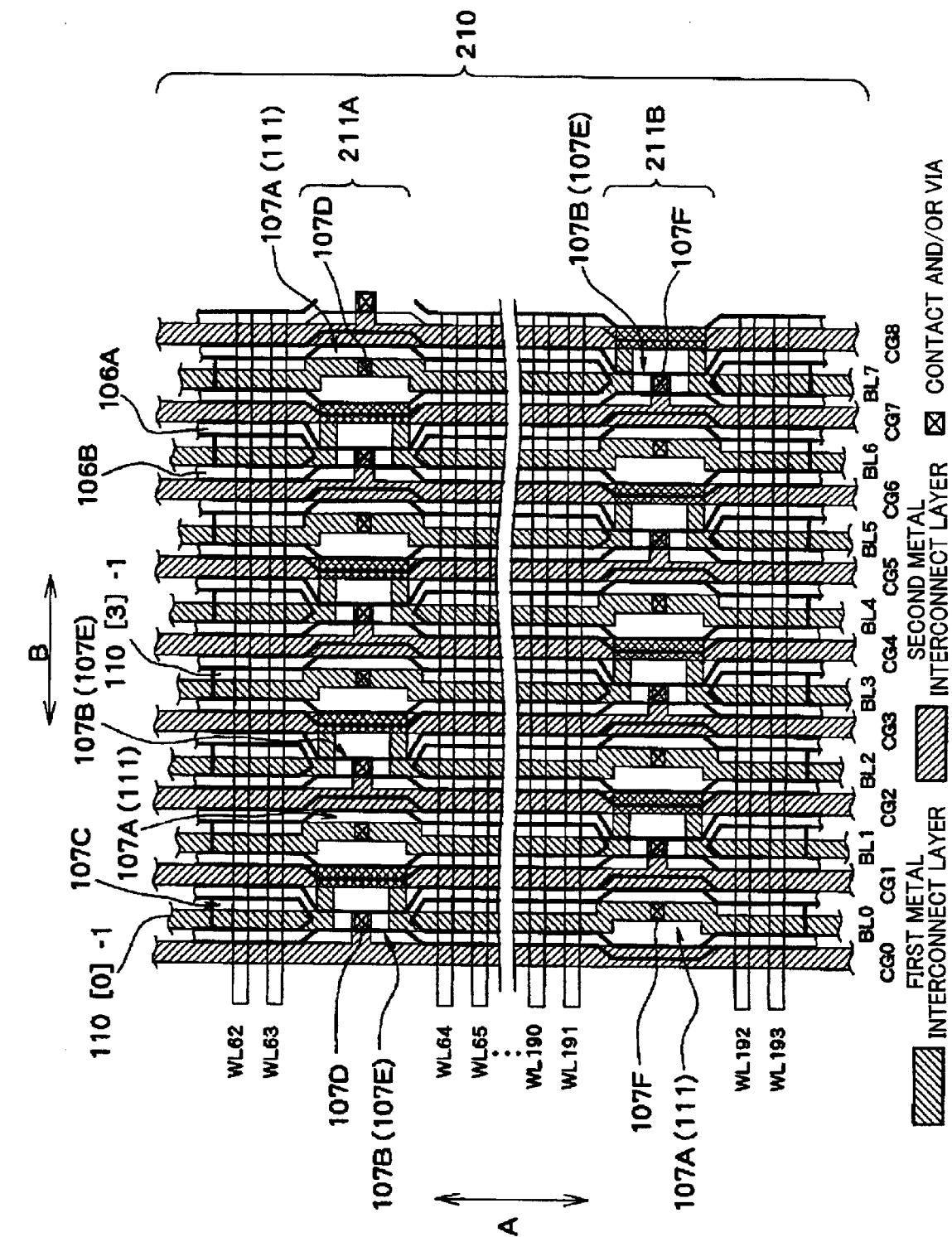
FIG. 10 is a wiring diagram of a memory cell array region in the memory block shown in FIG. 9.

The control gate lines 106A and 106B are disposed on opposite sides of each of the sub bit lines BL0, BL1, . . . , as shown in FIG. 10. Therefore, the total number of the control gate lines 106A and 106B is approximately twice the total number of the sub bit lines BL0, BL1, . . . .

Figure 12:
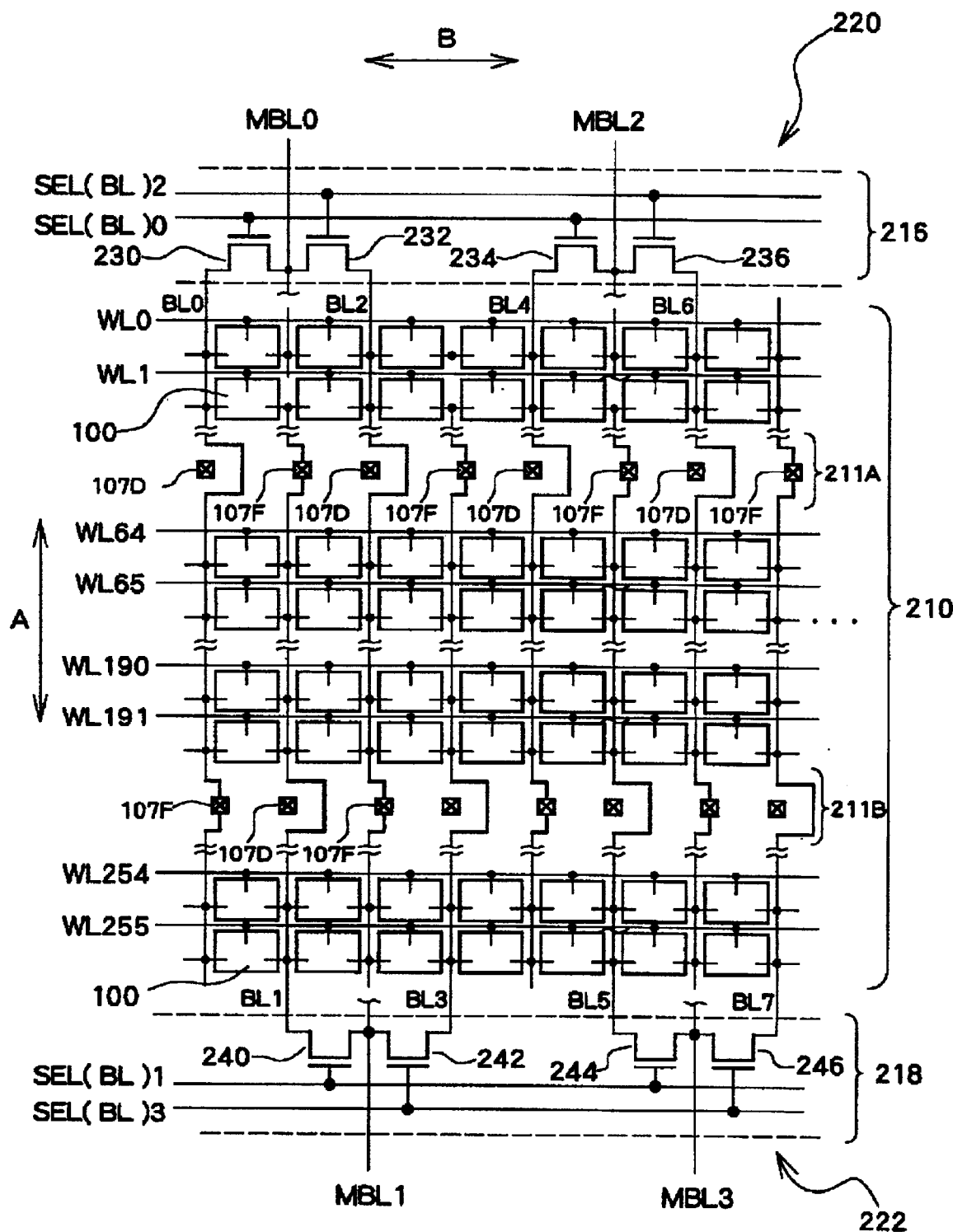
FIG. 12 is a wiring diagram showing the relationship between sub bit lines and main bit lines in the memory cell array shown in FIG. 10.

In FIG. 12, the even-numbered sub bit lines BL0, BL2, BL4, . . . extend to the even-numbered sub bit select circuit 216 in the first select region 220 disposed on one end in the first direction A. The odd-numbered sub bit lines BL1, BL3, BL5, . . . extend to the odd-numbered sub bit select circuit 218 in the second select region 222 disposed on the other end in the first direction A.

Figure 13:
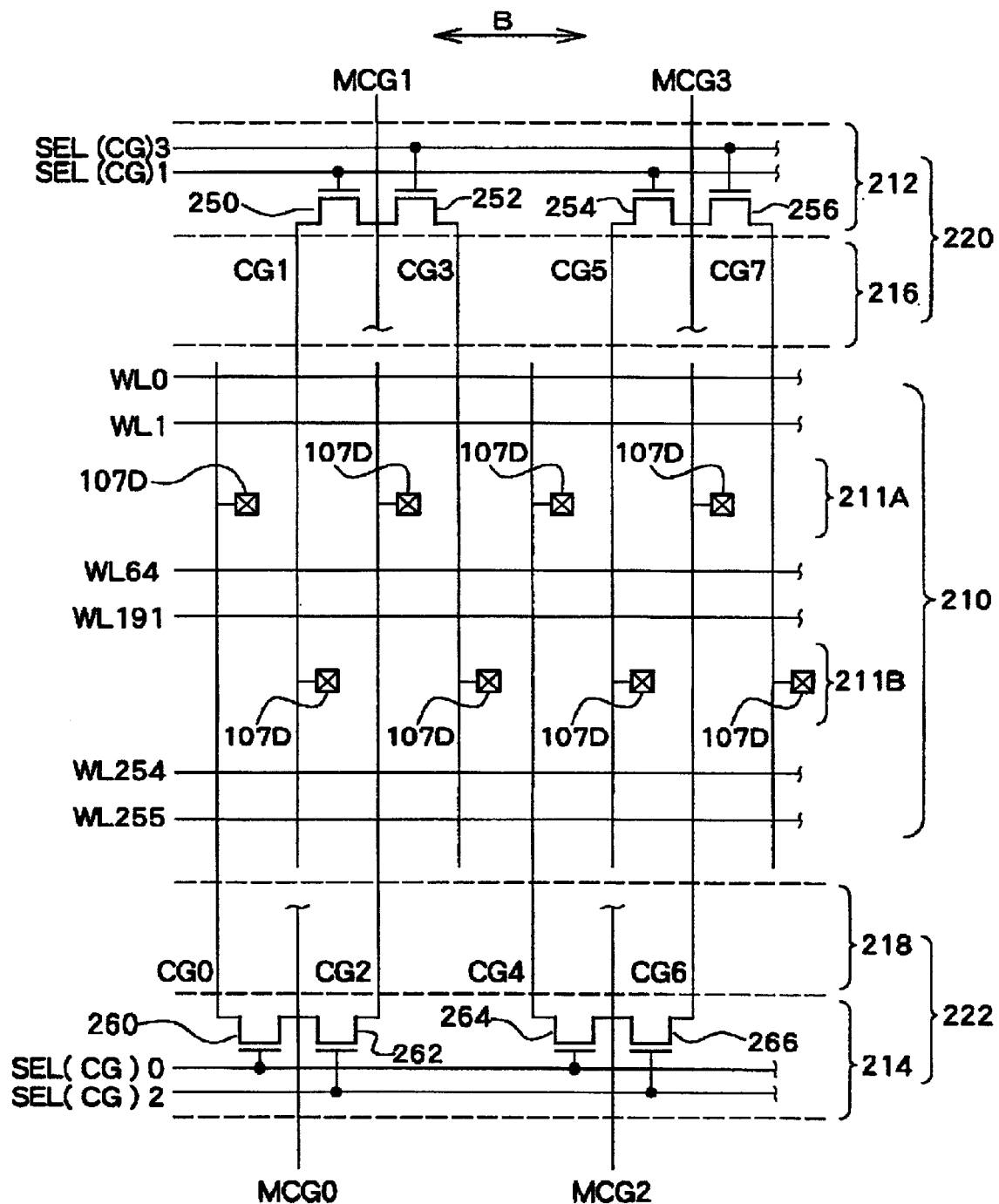
FIG. 13 is a wiring diagram showing the relationship between sub control gate lines and main control gate lines in the memory cell array shown in FIG. 10.

The even-numbered sub control gate lines CG0, CG2, . . . extend to the even-numbered sub control gate select circuit 214 in the second select region 222, as shown in FIG. 13. The odd-numbered sub control gate lines CG1, CG3, . . . extend to the odd-numbered sub control gate select circuit 212 in the first select region 220, as shown in FIG. 13.

The even-numbered sub bit select circuit 216 formed in the first select region 220 includes transistors 230 and 232 which selectively connect either the even-numbered sub bit line BL0 or the even-numbered sub bit line BL2 with the main bit line MBL0, which is the third metal interconnect layer, based on the potential of the select signal lines SEL (BL) 0 and SEL (BL) 2, as shown in FIG. 12. Transistors 234 and 236 connect either the even-numbered sub bit line BL4 or the even-numbered sub bit line BL6 with the main bit line MBL2.

The odd-numbered sub bit select circuit 218 formed in the second select region 222 includes transistors 240 and 242 which selectively connect either the odd-numbered sub bit line BL1 or the odd-numbered sub bit line BL3 with the main bit line MBL1, which is the third metal interconnect layer, based on the potential of the select signal lines SEL (BL) 1 and SEL (BL) 3, as shown in FIG. 12. Transistors 244 and 246 connect either the odd-numbered sub bit line BL5 or the odd-numbered sub bit line BL7 with the main bit line MBL3.

The odd-numbered subcontrol gate select circuit 212 formed in the first select region 220 includes transistors 250 and 252 which selectively connect either the odd-numbered sub control gate line CG1 or the odd-numbered sub control gate line CG3 with the main control gate line MCG1, which is the third metal interconnect layer, based on the potential of the select signal lines SEL (CG) 1 and SEL (CG) 3, as shown in FIG. 13. Transistors 254 and 256 connect either the odd-numbered sub control gate line CG5 or the odd-numbered sub control gate line CG7 with the main control gate line MCG3.

The even-numbered sub control gate select circuit 214 formed in the second select region 222 includes transistors 260 and 262 which selectively connect either the even-numbered sub control gate line CG0 or the even-numbered sub control gate line CG2 with the main control gate line MCG0, which is the third metal interconnect layer, based on the potential of the select signal lines SEL (CG) 0 and SEL (CG) 2, as shown in FIG. 13. Transistors 264 and 266 connect either the even-numbered sub control gate line CG4 or the even-numbered sub control gate line CG6 with the main control gate line MCG2.

The above-described data read, write (program), and erase operations of the memory cells 100 can be performed by changing the main-sub connection using the respective odd-numbered and even-numbered sub control gate select circuits 212 and 214 and the respective odd-numbered and even-numbered sub bit select circuits 216 and 218 while driving the main control gate line MCG and the main bit line MBL using the main control gate line driver 202 and main bit line driver 204.

In FIG. 12, the select signal line SEL (BL) 0 is connected in common with the gates of the transistors 230 and 234. However, two select signal lines SEL (BL) maybe used. Other select signal lines SEL (BL) 1 to SEL (BL) 3 and select signal lines SEL (CG) 0 to SEL (CG) 3 shown in FIG. 13 may also be divided into two select signal lines.

Wiring Layout

Figure 11:
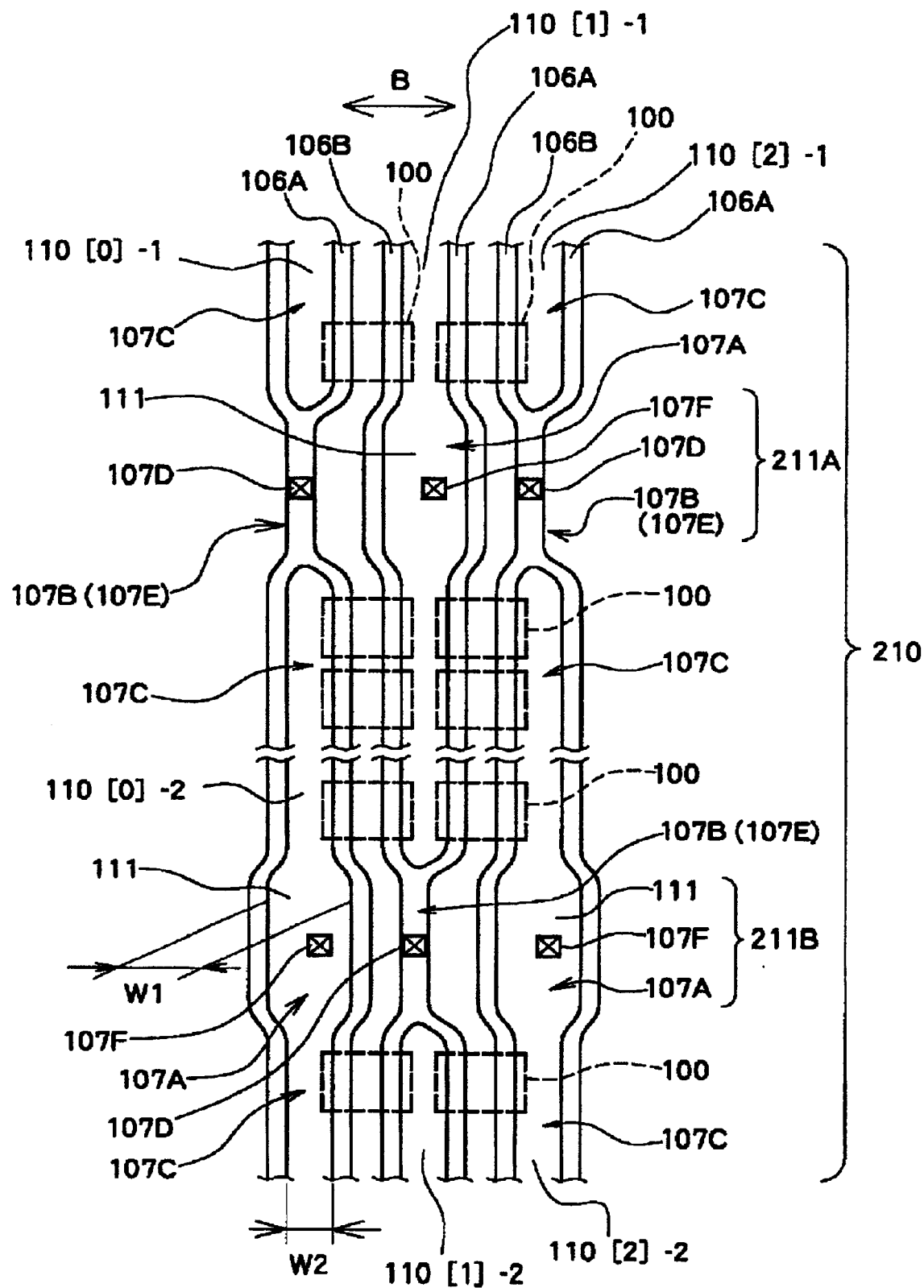
FIG. 11 is a wiring diagram showing an example of a wiring layout of bit lines and control gate lines in the memory cell array region shown in FIG. 10.

As shown in FIG. 11, each two control gate lines 106B and 106A adjacent in the second direction B across the boundaries between a plurality of memory cells 100 have a wide spacing region 107A having a large line-to-line width of W1, a common connection region 107B in which the two lines are connected in common in one line, and a narrow spacing region 107C having a small line-to-line width of W2, which is disposed in a region other than the wide spacing region 107A and the common connection region 107B.

Each two control gate lines 106B and 106A adjacent in the second direction B across the boundaries between a plurality of memory cells 100 are connected with each of the sub control gate lines CG0, CG1, CG2, CG3, . . . through a connection section 107D formed in the common connection region 107B (see FIGS. 10 and 11).

The sub control gate lines CG0, CG1, CG2, CG3, . . . connected with each two control gate lines 106B and 106A consist of the second metal interconnect layer. Therefore, a contact which connects the common connection region 107B with the first metal interconnect layer, the island-like first metal interconnect layer, and a via which connects the first metal interconnect layer with the sub control gate line are formed in the connection section 107D.

The bit line 110 [0] is divided into a plurality of sections by a discontinuous region 107E which faces the common connection region 107B. In FIG. 11, two bit split lines 110 [0]-1 and 110 [0]-2 are illustrated. The bit split lines 110 [0]-1 and 110 [0]-2 are formed of the impurity layers. In order to decrease the resistance of the bit split lines, a silicide may be formed on the surface of the impurity layers. The bit split lines 110 [0]-1 and 110 [0]-2 which make up one bit line 110 [0] are connected with one sub bit line BL0.

The bit split line 110 [0]-2 has an enlarged region 111 in which the line width is increased from the width W2 to the width W1 in a region which faces the wide spacing region 107A. The bit split line 110 [0]-2 is connected with the sub bit line BL0 through a contact 107F formed in the enlarged region 111. The bit split line 110 [0]-1 is connected with the sub bit line BL through the contact 107F (not shown) formed in the enlarged region 111 (not shown) disposed outside the region in which the memory cells 100 are formed.

Since the bit lines 110 [0]-1 and 110 [0]-2 divided into a plurality of sections (two, for example) are backed by the sub bit line BL0 extending along the first direction A, the potential of the bit lines 110 [0]-1 and 110 [0]-2 can be set to the same value.

The above-described structure of the bit line 110 [0] and the connection with the sub bit line BL0 are also applied to other bit lines 100 [1], 100 [2], 100 [3], . . . .

As shown in FIG. 11, the wide spacing regions 107A are disposed in the second direction B, one on each side of the common connection region 107B.

First and second wiring-only regions 211A and 211B are formed in the memory cell array region 210 at an interval in the first direction A (see FIGS. 10 to 13). As shown in FIG. 10, the wide spacing regions 107A of each two control gate lines connected to the odd-numbered sub control gate lines CG1, CG3, CG5, CG7, . . . , and the common connection regions 107B of each two control gate lines connected to the even-numbered sub control gate lines CG0, CG2, CG4, CG6, . . . are formed in the first wiring-only region 211A.

The wide spacing regions 107A of each two control gate lines connected to the even-numbered sub control gate lines CG0, CG2, CG4, CG6, . . . , and the common connection regions 107B of each two control gate lines connected to the odd-numbered sub control gate lines CG1, CG3, CG5, CG7, . . . are formed in the second wiring-only region 211B.

As shown in FIGS. 10 and 11, the connection section 107D connected to the sub control gate line CG and the contact 107F connected to the sub bit line BL adjacent to the sub control gate line CG are present almost in a single line extending along the first direction A. Because of this, the sub bit line BL is formed to detour to the right to avoid the connection section 107D in the first wiring-only region 211A or the second wiring-only region 211B, as shown in FIGS. 10 and 12.

The sub control gate CG is formed to detour to the right to a small extent at a position adjacent to the position at which the sub bit line BL is formed to detour to the right in order to secure the space between the sub control gate CG and the sub bit line BL. This is because the common connection region 107B is formed at a position shifted to the right from the center between two control gate lines 106B and 106A in FIG. 10. If the common connection region 107B is formed midway between two control gate lines 106B and 106A, it is unnecessary to have the sub control gate line CG make a detour.

The reason why the wide spacing regions 107A are disposed in the second direction B, one on each side of the common connection region 107B as shown in FIG. 11 is describe below.

Specifically, in the second wiring-only region 211B in which the contacts 107F are formed for the even-numbered bit split lines 110 [0]-2 and 110 [2]-2, the width of the bit split lines must be increased from the width W2 to the width W1 in order to secure the connection region with the contacts 107F. If the odd-numbered bit line 110 [1] is formed between the enlarged regions 111 of the even-numbered bit split lines 110 [0]-2 and 110 [2]-2, the pitch of the bit lines must be increased. This hinders an increase in the degree of integration of the memory cells.

Therefore, the discontinuous region 107E of the bit line 110 [1] is disposed between the enlarged regions 111 of the even-numbered bit split lines 110 [0]-2 and 110 [2]-2, whereby the pitch of the bit lines is minimized.

The wide spacing regions 107A of the control gate lines are disposed in the enlarged regions 111 of the even-numbered bit split lines 110 [0]-2 and 110 [2]-2. Since the width between the two wide spacing regions 107A is small, the common connection region 107B of the control gate lines 106B and 106A is disposed in this narrow region. This enables the space to be secured between the adjacent control gate lines.

In the first wiring-only region 211A, the discontinuous region 107E of the even-numbered bit line is formed between the enlarged regions 107A of the odd-numbered bit split lines. The common connection region 107B of two control gate lines 106B and 106A is formed in this region.

The present invention is not limited to the above-described embodiment, and various modifications can be made within the scope of the invention.

For example, the structure of the nonvolatile memory elements 108A and 108B is not limited to the MONOS structure. The present invention can be applied to a nonvolatile semiconductor memory device using various types of other memory cells capable of independently trapping charges at two sites by one word gate 104 and two control gates 106A and 106B.

In FIG. 10, the respective even-numbered and odd-numbered sub bit lines BL alternately extend in the opposite directions. However, the extending direction may be the same. In this case, the sub bit select circuits 216 and 218 are formed in either the first select region 220 or the second select region 222, and the sub control gate select circuits 212 and 214 are formed in the other.

What is claimed is:

1. A nonvolatile semiconductor memory device comprising:

a memory cell array region in which a plurality of memory cells are arranged in first and second directions intersecting each other, each of the memory cell shaving two nonvolatile memory elements and being controlled by one word gate and two control gates, wherein the memory cell array region includes:

a plurality of control gate lines which connects in the first direction the control gates in each column of the memory cells disposed in the first direction; and sub control gate lines extending in the first direction in an upper layer of the control gate lines, the number of the sub control gate lines being half the number of the control gate lines, wherein each of the sub control gate lines is connected to adjacent two of the control gate lines in adjacent two of the memory cells in the second direction;

wherein each two of the control gate lines have a wide spacing region having a large line-to-line width, a common connection region in which the two lines are connected in common in one line, and a narrow spacing region having a small line-to-line width; and wherein the wide spacing regions are disposed on both sides of the common connection region in the second direction.

2. The nonvolatile semiconductor memory device as defined in claim 1, wherein the width of the common connection region is larger than the width of each two of the control gate lines in the wide spacing region.

3. The nonvolatile semiconductor memory device as defined in claim 2, wherein each two of the control gate lines are connected with one of the sub control gate lines at the common connection region having a large width.

4. The nonvolatile semiconductor memory device as defined in claim 1, wherein first and second wiring-only regions are formed in the memory cell array region and separated from each other in the first direction;

wherein the common connection region is connected to an even-numbered sub control gate line, and the wide spacing region is connected to an odd-numbered sub control gate line, in the first wiring-only region; and wherein the common connection region is connected to an odd-numbered sub control gate line, and the wide spacing region is connected to an even-numbered sub control gate line, in the second wiring-only region.

5. The nonvolatile semiconductor memory device as defined in claim 1, further comprising:

a plurality of bit lines disposed between each two of the control gate lines and formed of impurity layers extending in the first direction; and a plurality of sub bit lines which extend in the first direction in an upper layer of the bit lines and are connected to the bit lines, the number of the sub bit lines being equal to the number of the bit lines, wherein each of the bit lines is divided into a plurality of bit split lines by a discontinuous region which faces the common connection region; and wherein each of the sub bit lines is connected to the bit split lines which make up one of the bit lines.

6. The nonvolatile semiconductor memory device as defined in claim 5, wherein each of the bit lines has an enlarged region which faces the wide spacing region of each two of the control gate lines and has an increased line width, each of the bit lines being connected to the sub bit lines at the enlarged region.

7. The nonvolatile semiconductor memory device as defined in claim 6, wherein the sub bit lines make up a first metal interconnect layer.

8. The nonvolatile semiconductor memory device as defined in claim 7, wherein the sub control gate lines make up a second metal interconnect layer.

9. The nonvolatile semiconductor memory device as defined in claim 8, wherein each of the bit lines is connected to one of the sub bit lines through a contact formed in the enlarged region, and wherein each two of the control gate lines are connected with one of the sub control gate lines through a connection section formed in the common connection region.

10. The nonvolatile semiconductor memory device as defined in claim 9, wherein the connection section includes a contact, the island-like first metal interconnect layer, and a via.

11. The nonvolatile semiconductor memory device as defined in claim 9, wherein the contact and the connection section are substantially formed in a single line in the first direction, each of the sub bit lines avoiding the connection section.

12. The nonvolatile semiconductor memory device as defined in claim 5, further comprising:

a select region disposed adjacent to the memory cell array region in the first direction;

a plurality of main control gate lines extending in the first direction in the select region and the memory cell array region, the number of the main control gate lines being smaller than the number of the sub control gate lines; and a plurality of main bit lines extending in the first direction in the select region and the memory cell array region, the number of the main bit lines being smaller than the number of the sub bit lines, wherein the select region includes:

a sub control gate select circuit which selectively connects the sub control gate lines with the main control gate lines; and a sub bit select circuit which selectively connects the sub bit lines with the main bit lines.

13. The nonvolatile semiconductor memory device as defined in claim 12, wherein the main bit lines and the main control gate lines make up a third metal interconnect layer.

14. The nonvolatile semiconductor memory device as defined in claim 12, wherein the select region includes first and second select regions disposed on both sides of the memory cell array region in the first direction, wherein the first select region includes:

a first sub bit select circuit which selectively connects one of an odd-numbered sub bit line and an even-numbered sub bit line with the main bit lines; and a first sub control gate select circuit which selectively connects one of an odd-numbered sub control gate line and an even-numbered sub control gate line with the main control gate lines, and wherein the second select region includes:

a second sub bit select circuit which selectively connects the other of the odd-numbered sub bit line and the even-numbered sub bit line with the main bit lines; and a second sub control gate select circuit which selectively connects the other of the odd-numbered sub control gate line and the even-numbered sub control gate line with the main control gate lines.

15. The nonvolatile semiconductor memory device as defined in claim 14, wherein a plurality of memory blocks each of which is formed of the memory cell array region and the first and second select regions disposed on both sides of the memory cell array region are arranged in the first direction.

16. The nonvolatile semiconductor memory device as defined in claim 15, wherein a main bit line driver which drives the plurality of the main bit lines is provided on one end of the memory blocks arranged in the first direction; and wherein a main control gate line driver which drives the plurality of the main control gate lines is provided on the other end of the memory blocks arranged in the first direction.

17. The nonvolatile semiconductor memory device as defined in claim 15, wherein a word line driver which drives a plurality of word lines is provided on either side of the memory blocks in the second direction.

18. The nonvolatile semiconductor memory device as defined in claim 17, wherein the memory blocks are disposed on both sides of the word line driver in the second direction.

19. The nonvolatile semiconductor memory device as defined in claim 1, wherein each of the two nonvolatile memory elements has an ONO film consisting of an oxide film (O), nitride film (N), and oxide film (O) as a charge trap site.

* * * * *